United States Patent
Oda et al.

(10) Patent No.: US 10,043,864 B2
(45) Date of Patent: Aug. 7, 2018

(54) THIN FILM SEMICONDUCTOR DEVICE

(71) Applicant: Toshiba Memory Corporation, Minato-ku (JP)

(72) Inventors: Minoru Oda, Yokkaichi (JP); Shinji Mori, Yokkaichi (JP); Kiwamu Sakuma, Yokkaichi (JP); Masumi Saitoh, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/223,632

(22) Filed: Jul. 29, 2016

(65) Prior Publication Data
US 2017/0033175 A1    Feb. 2, 2017

(30) Foreign Application Priority Data

Jul. 31, 2015    (JP) .................. 2015-152626

(51) Int. Cl.
*H01L 29/76* (2006.01)
*H01L 29/04* (2006.01)
(Continued)

(52) U.S. Cl.
CPC ........ *H01L 29/045* (2013.01); *H01L 29/6675* (2013.01); *H01L 29/66666* (2013.01);
(Continued)

(58) Field of Classification Search
CPC ............. H01L 29/045; H01L 29/78672; H01L 29/78684; H01L 29/66742;
(Continued)

(56) References Cited

U.S. PATENT DOCUMENTS 5,208,172 A * 5/1993 Fitch ................. H01L 21/82348
257/E21.41
6,548,331 B2 * 4/2003 Lee ................... H01L 29/66757
257/E21.413
(Continued)

FOREIGN PATENT DOCUMENTS

JP    7-297406 A    11/1995
JP    2002-329871 A    11/2002
(Continued)

OTHER PUBLICATIONS

A. Nakamura, et al., "A high-Reliability, Low-Operation-Voltage Monolithic Active-Matrix LCD by Using Advanced Solid-Phase-Growth Technique," Electronics Research Laboratory, Electronics Corporation, 1990, pp. 34.2.1 to 34.2.4.
(Continued)

*Primary Examiner* — Shouxiang Hu
(74) *Attorney, Agent, or Firm* — Oblon, McClelland, Maier & Neustadt, L.L.P.

(57) ABSTRACT

According to one embodiment, a semiconductor device includes a first semiconductor layer, a second semiconductor layer, a third semiconductor layer, and a first electrode. The third semiconductor layer is provided between the first semiconductor layer and the second semiconductor layer. The first electrode opposes the third semiconductor layer. An orientation ratio of the third semiconductor layer is higher than an orientation ratio of the first semiconductor layer.

18 Claims, 9 Drawing Sheets

(51) Int. Cl.
*H01L 29/786* (2006.01)
*H01L 29/66* (2006.01)
*H01L 29/78* (2006.01)

(52) U.S. Cl.
CPC .... *H01L 29/66742* (2013.01); *H01L 29/7827* (2013.01); *H01L 29/78618* (2013.01); *H01L 29/78621* (2013.01); *H01L 29/78642* (2013.01); *H01L 29/78672* (2013.01); *H01L 29/78681* (2013.01); *H01L 29/78684* (2013.01); *H01L 29/78696* (2013.01)

(58) Field of Classification Search
CPC ......... H01L 29/78696; H01L 29/78618; H01L 29/78642; H01L 29/78681; H01L 29/04; H01L 29/66666; H01L 29/6675; H01L 29/7827; H01L 29/78621
USPC .......................... 257/66, 64, 329, 59, 72, 302
See application file for complete search history.

(56) References Cited

U.S. PATENT DOCUMENTS

| | | | | |
|---|---|---|---|---|
| 2002/0052069 A1* | 5/2002 | Jiroku | ................ | H01L 21/2026 438/166 |
| 2002/0100909 A1* | 8/2002 | Yamaguchi | ............. | H01L 27/12 257/59 |
| 2003/0092224 A1* | 5/2003 | Hwang | ............... | H01L 27/1214 438/151 |
| 2003/0102508 A1* | 6/2003 | Lee | ..................... | H01L 27/1285 257/359 |
| 2003/0218170 A1* | 11/2003 | Yamazaki | ........... | H01L 21/2026 257/59 |
| 2006/0054940 A1 | 3/2006 | Kurabayashi et al. | | |
| 2014/0117366 A1 | 5/2014 | Saitoh | | |

FOREIGN PATENT DOCUMENTS

| | | |
|---|---|---|
| JP | 2009-212331 A | 9/2009 |
| JP | 2014-93319 A | 5/2014 |

OTHER PUBLICATIONS

S. Hasegawa, et al., "Structure of recrystallized silicon films prepared from amorphous silicon deposited using disilane," AIP Publishing, vol. 62 No. 11, Mar. 15, 1993, pp. 1218-1220 plus cover page.

* cited by examiner

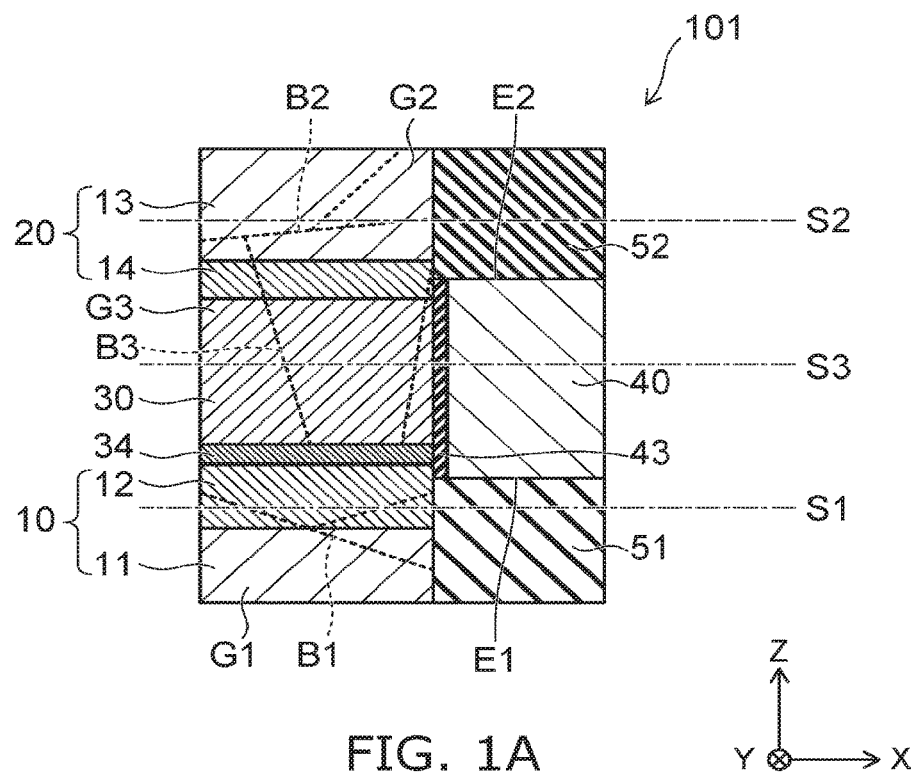
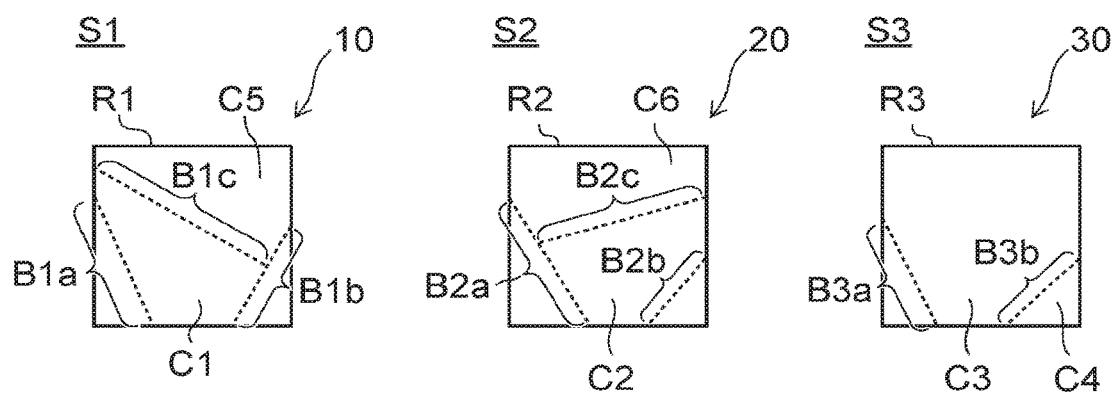
FIG. 1B  FIG. 1C  FIG. 1D

THIN FILM SEMICONDUCTOR DEVICE

CROSS-REFERENCE TO RELATED APPLICATIONS

This application is based upon and claims the benefit of priority from Japanese Patent Application No. 2015-152626, filed on Jul. 31, 2015; the entire contents of which are incorporated herein by reference.

FIELD

Embodiments described herein relate generally to a semiconductor device.

BACKGROUND

There are semiconductor devices such as thin film transistors (TFTs) and the like in which a semiconductor is a major material of the channel. For example, the channel includes a polycrystalline semiconductor. It is desirable to improve the mobility of the carriers in the semiconductor device.

BRIEF DESCRIPTION OF THE DRAWINGS

FIG. 1A to FIG. 1D are schematic cross-sectional views showing a semiconductor device according to a first embodiment;

DETAILED DESCRIPTION

Figure 2A:
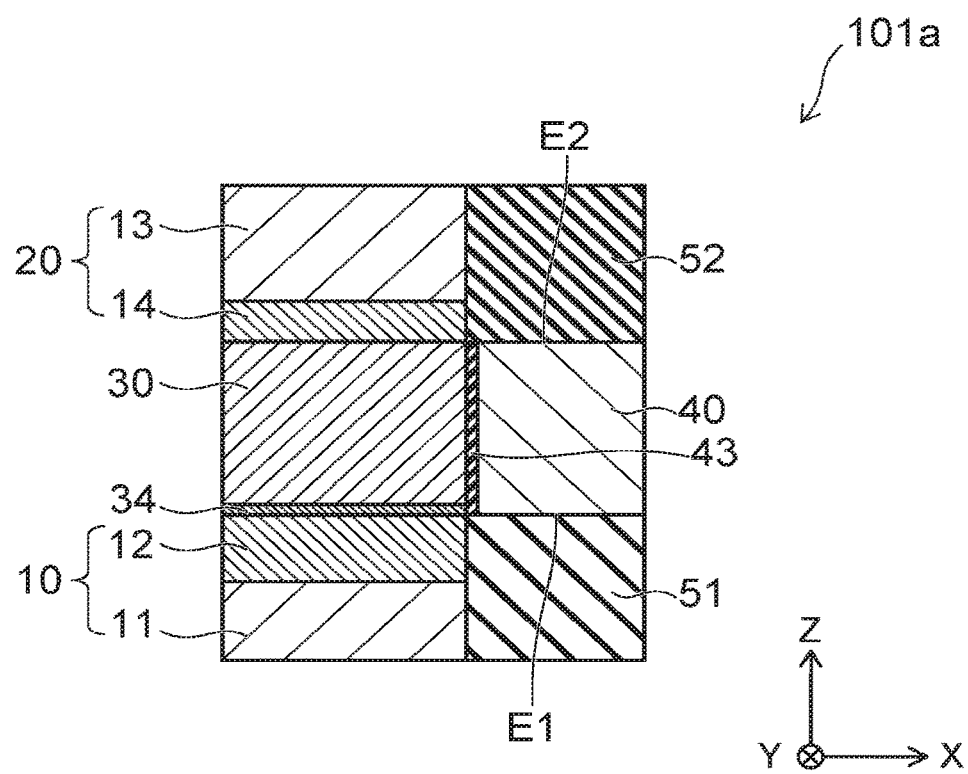
FIG. 2A and FIG. 2B are schematic cross-sectional views showing other semiconductor devices according to the first embodiment.

According to one embodiment, a semiconductor device includes a first semiconductor layer, a second semiconductor layer, a third semiconductor layer, and a first electrode. The third semiconductor layer is provided between the first semiconductor layer and the second semiconductor layer. The first electrode opposes the third semiconductor layer. An orientation ratio of the third semiconductor layer is higher than an orientation ratio of the first semiconductor layer.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

FIG. 1A to FIG. 1D are schematic cross-sectional views showing a semiconductor device according to a first embodiment.

As shown in FIG. 1A, the semiconductor device 101 according to the embodiment includes a first semiconductor layer 10, a second semiconductor layer 20, a third semiconductor layer 30, and a first electrode 40. The semiconductor device 101 further includes a fourth semiconductor layer 34, an insulating film 43, an insulating layer 51, and an insulating layer 52. The semiconductor device 101 is, for example, a thin film transistor.

In the following description, a first direction from the first semiconductor layer 10 toward the second semiconductor layer 20 is taken as a Z-axis direction. One direction perpendicular to the Z-axis direction is taken as an X-axis direction. A direction perpendicular to the X-axis direction and the Z-axis direction is taken as a Y-axis direction.

The first semiconductor layer 10 includes, for example, a first layer 11 and a second layer 12. The second layer 12 is stacked on the first layer 11 and is provided between the first layer 11 and the third semiconductor layer 30.

The first semiconductor layer 10 includes an impurity of a first conductivity type. For example, the first semiconductor layer 10 includes phosphorus (P) or arsenic (As) as the impurity of the first conductivity type. The first semiconductor layer 10 is electrically connected to the third semiconductor layer 30. The first semiconductor layer 10 is, for example, one of a source region or a drain region of the transistor.

The concentration of the impurity of the first conductivity type in the second layer 12 is lower than the concentration of the impurity of the first conductivity type in the first layer 11. For example, the second layer 12 is a layer (e.g., a non-doped layer) that substantially does not include a conductive impurity. The impurity concentration of the first layer 11 is, for example, not less than $1 \times 10^{20}$ cm$^{-3}$ and not more than $1 \times 10^{23}$ cm$^{-3}$. The impurity concentration of the second layer 12 is, for example, not less than $1 \times 10^{14}$ cm$^{-3}$ and not more than $1 \times 10^{20}$ cm$^{-3}$.

In the example, the first conductivity type is an n-type; and a second conductivity type is a p-type. However, in the embodiment, the first conductivity type may be the p-type; and the second conductivity type may be the n-type. For example, boron (B) or gallium (Ga) may be used as the p-type impurity.

The concentration of the impurity of the first conductivity type in the second layer 12 may be zero, or below the detection limit. The second layer 12 may not include the impurity of the first conductivity type. These cases are included in a state in which "the concentration of the impurity of the first conductivity type in the first layer 11 is higher than the concentration of the impurity of the first conductivity type in the second layer 12".

The thickness (the length along the Z-axis direction) of the first layer 11 is, for example, not less than 5 nanometers (nm) and not more than 1 micrometer (μm). The thickness (the length along the Z-axis direction) of the second layer 12 is, for example, not less than 1 nm and not more than 100 nm.

The first semiconductor layer 10 (the first layer 11 and the second layer 12) includes a crystal of a first material. The first material may include, for example, at least one of silicon (Si), germanium (Ge), $Si_xGe_{1-x}$ (0<x<1), gallium antimonide (GaSb), $In_xGa_{1-x}As$ (0≤x≤1), or $In_xGa_{1-x}Sb$ (0≤x≤1). The first semiconductor layer 10 (the first layer 11 and the second layer 12) is a polycrystalline semiconductor layer of the first material.

In the case where Si or Ge is used as the first material of the first semiconductor layer 10, P or As may be used as the n-type impurity; and B or Ga may be used as the p-type impurity. In the case where a group III-V compound (InGaAs, GaAs, GaSb, etc.) is used as the first material of the first semiconductor layer 10, Si may be used as the n-type impurity; and zinc (Zn) or beryllium (Be) may be used as the p-type impurity.

The second semiconductor layer 20 is provided to be separated from the first semiconductor layer 10 in the first direction.

The second semiconductor layer 20 includes a third layer 13 and a fourth layer 14. The fourth layer 14 is provided between the third layer 13 and the third semiconductor layer 30.

The second semiconductor layer 20 includes the impurity of the first conductivity type. The second semiconductor layer 20 is electrically connected to the third semiconductor layer 30. The second semiconductor layer 20 is, for example, the other of the source region or the drain region of the transistor.

The concentration of the impurity of the first conductivity type in the fourth layer 14 is lower than the concentration of the impurity of the first conductivity type in the third layer 13. For example, the fourth layer 14 is a layer (e.g., a non-doped layer) that substantially does not include a conductive impurity. The impurity concentration of the third layer 13 is, for example, not less than $1 \times 10^{20}$ cm$^{-3}$ and not more than $1 \times 10^{23}$ cm$^{-3}$. The impurity concentration of the fourth layer 14 is, for example, not less than $1 \times 10^{14}$ cm$^{-3}$ and not more than $1 \times 10^{20}$ cm$^{-3}$.

The thickness (the length along the Z-axis direction) of the third layer 13 is, for example, not less than 5 nanometers (nm) and not more than 1 μm. The thickness (the length along the Z-axis direction) of the fourth layer 14 is, for example, not less than 1 nm and not more than 100 nm.

The concentration of the impurity of the first conductivity type in the fourth layer 14 may be zero, or below the detection limit. The fourth layer 14 may not include the impurity of the first conductivity type. These cases are included in a state in which "the concentration of the impurity of the first conductivity type in the third layer 13 is higher than the concentration of the impurity of the first conductivity type in the fourth layer 14".

The second semiconductor layer 20 (the third layer 13 and the fourth layer 14) includes a crystal of the first material and is, for example, a polycrystalline semiconductor layer of the first material.

The third semiconductor layer 30 is provided between the first semiconductor layer 10 and the second semiconductor layer 20. The third semiconductor layer 30 is, for example, a channel region of the transistor. The third semiconductor layer 30 includes a crystal of the first material and is, for example, a polycrystalline semiconductor layer of the first material.

The impurity concentration of the first conductivity type in the third semiconductor layer 30 is lower than the impurity concentration of the first conductivity type in the first semiconductor layer 10 and lower than the impurity concentration of the first conductivity type in the second semiconductor layer 20. For example, the third semiconductor layer 30 substantially does not include a conductive impurity. Or, the third semiconductor layer 30 may include an impurity of the second conductivity type. Thereby, the threshold of the transistor can be adjusted. The third semiconductor layer 30 may include an impurity such as fluorine (F), hydrogen (H), etc., to improve the electrical characteristics. The thickness of the third semiconductor layer 30 is, for example, not less than 50 nm and not more than 10 μm.

The fourth semiconductor layer 34 is provided between the first semiconductor layer 10 and the third semiconductor layer 30. The fourth semiconductor layer 34 includes, for example, the first material. The fourth semiconductor layer 34 is, for example, a seed layer that controls the crystallinity of the third semiconductor layer 30 formed on the fourth semiconductor layer 34. The thickness of the fourth semiconductor layer 34 is, for example, not less than 1 nm and not more than 10 nm.

The first electrode 40 opposes the third semiconductor layer 30. At least a portion of the first electrode 40 is arranged with the third semiconductor layer 30 in a direction (e.g., the X-axis direction) intersecting the Z-axis direction. At least a portion of the first electrode 40 overlaps the third semiconductor layer 30 in a direction intersecting the Z-axis direction. The first electrode 40 is, for example, a gate electrode of the transistor. The gate length (the length along the Z-axis direction of the first electrode 40) is, for example, not less than 50 nm and not more than 10 μm.

The first electrode 40 includes, for example, at least one of tungsten (W), tantalum (Ta), tantalum nitride (TaN), titanium (Ti), titanium nitride (TiN), nickel (Ni), or cobalt (Co). The first electrode 40 may include a metal silicide made by Si reacting with at least one of these materials. The first electrode 40 may include polysilicon including an impurity (doped poly-Si).

At least a portion of the insulating film 43 is provided between the third semiconductor layer 30 and the first electrode 40. The insulating film 43 is, for example, a gate insulating film of the transistor. The insulating film 43 may include, for example, a material such as silicon oxide ($SiO_2$), aluminum oxide ($Al_2O_3$), hafnium oxide ($HfO_2$), zirconium oxide ($ZrO_2$), lanthanum oxide ($La_2O_3$), silicon nitride (SiN), silicon oxynitride (SiON), etc. The insulating film 43 may include a stacked film or a mixed film of these materials. The thickness (the length along the X-axis direction) of the insulating film 43 is, for example, not less than 1 nm and not more than 100 nm.

The insulating layer 51 and the insulating layer 52 are arranged with the first electrode 40 in the Z-axis direction. The first electrode 40 is provided between the insulating layer 51 and the insulating layer 52. For example, the insulating layer 51 insulates between the first electrode 40 and the first semiconductor layer 10. The insulating layer 52 insulates between the first electrode 40 and the second semiconductor layer 20. In the case where an interconnect layer (an interconnect layer 61, etc.) is provided at a lower portion (referring to FIG. 3), the insulating layer 51 insulates the first electrode 40 and the interconnect layer. Also, in the case where an interconnect layer (an interconnect layer 63, etc.) is provided at an upper portion (referring to FIG. 3), the insulating layer 52 insulates the first electrode 40 and the interconnect layer.

The insulating layer 51 includes, for example, silicon oxide, silicon nitride, or polysilazane (PSZ). The insulating layer 52 includes, for example, silicon oxide, silicon nitride, or polysilazane.

The semiconductor device 101 is, for example, a vertical TFT. The first to third semiconductor layers 10 to 30 are provided on a substrate 50 (referring to FIG. 3); and the direction in which the current of the transistor flows (the channel direction connecting the source and the drain) is substantially parallel to a direction perpendicular to a first surface 50*a* (a major surface) of the substrate 50. In other words, the first direction (the Z-axis direction) is intersecting the major surface of the substrate. For example, the first direction is perpendicular to the major surface of the substrate. The semiconductor device according to the embodiment may be a lateral TFT described below.

The structure of the semiconductor device 101 will now be described further. In the following description, the case is described where the first material is Si. In other words, the first semiconductor layer 10, the second semiconductor layer 20, and the third semiconductor layer 30 are polysilicon layers.

The orientation property (the orientation ratio) of the third semiconductor layer 30 is higher than the orientation property (the orientation ratio) of the first semiconductor layer 10 and higher than the orientation property (the orientation ratio) of the second semiconductor layer 20. In such a case, for example, the density of grain boundaries B3 in (for example, inside) the third semiconductor layer 30 is lower than the density of grain boundaries B1 in (for example, inside) the first semiconductor layer 10 and lower than the density of grain boundaries B2 in (for example, inside) the second semiconductor layer 20. That is, a volume of grain boundaries B3 per unit volume in the third semiconductor layer 30 is smaller than a volume of grain boundaries B1 per the unit volume in the first semiconductor layer 10, and is smaller than a volume of grain boundaries B2 per the unit volume in the second semiconductor layer 20.

FIG. 1B to FIG. 1D, respectively, illustrate a first cross section S1 of the first semiconductor layer 10, a second cross section S2 of the second semiconductor layer 20, and a third cross section S3 of the third semiconductor layer 30. The second cross section S2 is parallel to the first cross section S1. The third cross section S3 is parallel to the third cross section S3. For example, each of the first cross section S1, the second cross section S2 and the third cross section S3 crosses the first direction. For example, the first cross section S1, the second cross section S2 and the third cross section S3 are cross sections along the X-Y plane, respectively. The first semiconductor layer 10 includes a first grain boundary (for example, grain boundaries B1) existing in a first region R1 included in a first cross section S1. The second semiconductor layer 20 includes a second grain boundary (for example, grain boundaries B2) existing in a second region R2 included in a second cross section S2. The third semiconductor layer 30 includes a third grain boundary (for example, grain boundaries B3) existing in a third region R3 included in a third cross section S3. An area of the first region R1 is same as an area of the second region R2, and is same as an area of the third region R3.

In such a case, a length of the third grain boundary in the third region R3 is shorter than a length of the first grain boundary in the first region R1, and is shorter than a length of the second grain boundary in the second region. For example, the length of the first grain boundary is sum of a length B1*a*, a length B1*b*, and a length B1*c* shown in FIG. 1B (i.e., total length of grain boundaries B1). For example, the length of the second grain boundary is sum of a length B2*a*, a length B2*b*, and a length B2*c* shown in FIG. 1C (i.e., total length of grain boundaries B2). For example, the length of the third grain boundary is sum of a length B3*a* and a length B3*b* shown in FIG. 1D (i.e, total length of grain boundaries B3).

For example, the average size of crystal grains G3 in (for example, inside) the third semiconductor layer 30 is larger than the average size of crystal grains G1 in (for example, inside) the first semiconductor layer 10 and larger than the average size of crystal grains G2 in (for example, inside) the second semiconductor layer 20.

For example, the third semiconductor layer 30 has a designated crystal orientation. For example, the first semiconductor layer 10 and the second semiconductor layer 20 do not have a designated crystal orientation. For example, the crystals are oriented randomly in the first semiconductor layer 10 and the second semiconductor layer 20.

In other words, the orientation property (the orientation ratio) in a designated orientation (a first crystal orientation) of the Si crystal of the third semiconductor layer 30 is higher than the orientation property (the orientation ratio) in the designated orientation of the Si crystal of the first semiconductor layer 10. The orientation property in the first crystal orientation of the third semiconductor layer 30 is higher than the orientation property (the orientation ratio) in the first crystal orientation of the second semiconductor layer 20. That is, the density of the region of the third semiconductor layer 30 oriented in the first crystal orientation is higher than the density of the region of the first semiconductor layer 10 oriented in the first crystal orientation and higher than the density of the region of the second semiconductor layer 20 oriented in the first crystal orientation.

That is, a volume of the region oriented in the first crystal orientation per unit volume in the third semiconductor layer 30 is larger than a volume of the region oriented in the first crystal orientation per the unit volume in the first semiconductor layer 10, and is larger than a volume of the region oriented in the first crystal orientation per the unit volume in the second semiconductor layer 20.

For example, as shown in FIG. 1B, the first semiconductor layer 10 includes a first crystal region C1 having the first crystal orientation included in the first region R1 (a first cross section region). For example, the first crystal orientation is along the first direction. As shown in FIG. 1C, the second semiconductor layer 20 includes a second crystal region C2 having the first crystal orientation included in the second region R2 (a second cross section region). As shown in FIG. 1D, the third semiconductor layer 30 includes a third crystal region C3 having the first crystal orientation included in the third region R3 (a third cross section region). In such a case, an area of the third crystal region C3 in the third region R3 is larger than an area of the first crystal region C1 in the first region R1, and is larger than an area of the second crystal region C2 in the second region R2.

The orientation ratio of the first semiconductor layer 10 is a ratio of an area of the first crystal region C1 in the first cross section S1 to an entire area of the first semiconductor layer 10 in the first cross section S1. The orientation ratio of the second semiconductor layer 20 is a ratio of an area of the second crystal region C2 in the second cross section S2 to an entire area of the second semiconductor layer 20 in the second cross section S2. The orientation ratio of the third semiconductor layer 30 is a ratio of an area of the third crystal region C3 in the third cross section S3 to an entire area of the third semiconductor layer 30 in the third cross section S3.

The first crystal orientation is, for example, one of the <100> direction, the <110> direction, or the <111> direction.

The orientation property in the first crystal orientation of the third semiconductor layer 30 is higher than the orientation property (the orientation ratio) in the first crystal orientation of the first layer 11 and higher than the orientation property (the orientation ratio) in the first crystal orientation of the second layer 12. Also, the orientation property in the first crystal orientation of the third semiconductor layer 30 is higher than the orientation property (the orientation ratio) in the first crystal orientation of the third layer 13 and higher than the orientation property (the orientation ratio) in the first crystal orientation of the fourth layer 14.

For example, electron diffraction may be used to evaluate the orientation property (the orientation ratio). For example, the cross-sectional structure of the semiconductor device 101 is acquired; and the crystal orientation of the channel direction (the first direction) is attributed to one of <100>, <110>, or <111>. In such a case, in the third semiconductor layer 30, the proportion of the region (the crystal grains) oriented in one of the designated orientations is significantly larger than the proportion of the region oriented in the two other orientations. On the other hand, in the first semiconductor layer 10 and the second semiconductor layer 20, there is not a significantly large proportion of only region oriented in a designated crystal orientation.

In other words, the proportion of the region of the third semiconductor layer 30 having the first crystal orientation along the first direction is higher than the proportion of the region of the third semiconductor layer 30 having a crystal orientation (a second crystal orientation) different from the first crystal orientation along the first direction. That is, the third semiconductor layer 30 includes a first portion (crystal grains of the first material) and a second portion (crystal grains of the first material). In the first portion, the first direction is along the first crystal orientation. In the second portion, the first direction is along a second crystal orientation different from the first orientation. For example, the first portion corresponds to the third crystal region C3 shown in FIG. 1D, and the second portion corresponds to the fourth crystal region C4 shown in FIG. 1D. The proportion of the first portion in the third semiconductor layer 30 is higher than the proportion of the second portion in the third semiconductor layer 30.

On the other hand, the proportion of the region of the first semiconductor layer 10 having the first crystal orientation along the first direction is substantially the same as the proportion of the region of the first semiconductor layer 10 having the second crystal orientation along the first direction. That is, the first semiconductor layer 10 includes a third portion (crystal grains of the first material) and a fourth portion (crystal grains of the first material). In the third portion, the first direction is along the first crystal orientation. In the fourth portion, the first direction is along the second crystal orientation. For example, the third portion corresponds to the first crystal region C1 shown in FIG. 1B, and the fourth portion corresponds to the fifth crystal region C5 shown in FIG. 1B. The proportion of the third portion in the first semiconductor layer 10 is substantially same as the proportion of the fourth portion in the first semiconductor layer 10.

The proportion of the region of the second semiconductor layer 20 having the first crystal orientation along the first direction is substantially the same as the proportion of the region of the second semiconductor layer 20 having the second crystal orientation along the first direction. That is, the second semiconductor layer 20 includes a fifth portion (crystal grains of the first material) and a sixth portion (crystal grains of the first material). In the fifth portion, the first direction is along the first crystal orientation. In the sixth portion, the first direction is along the second crystal orientation. For example, the fifth portion corresponds to the second crystal region C2 shown in FIG. 1C, and the sixth portion corresponds to the sixth crystal region C6 shown in FIG. 1C. The proportion of the fifth portion in the second semiconductor layer 20 is substantially same as the proportion of the sixth portion in the second semiconductor layer 20.

Here, the "proportion" is the ratio in the observed cross section of the surface area of the region (the portion) oriented in the crystal orientation of interest to the surface area of the semiconductor layer to be evaluated. Or, the "proportion" may be the ratio of the volume of the region (the portion) oriented in the crystal orientation of interest to the volume of the semiconductor layer to be evaluated.

For example, in the case where the gate length is short, a density of grain boundaries (for example, a volume of grain boundaries per unit volume) extending along the Z-axis direction is higher than a density of grain boundaries extending along the X-axis direction or the Y-axis direction in the third semiconductor layer 30. On the other hand, inside the first and second semiconductor layers, the frequency that grain boundaries extending along the Z-axis direction occur is substantially equal to the frequency that grain boundaries extending along the X-axis direction or the Y-axis direction occur.

As shown in FIG. 1A, the first electrode 40 includes a first end portion E1 and a second end portion E2. The first end portion E1 and the second end portion E2 are end portions that are separated from each other in the first direction.

The first end portion E1 overlaps one of the third semiconductor layer 30 or the second layer 12 in a direction (e.g., the X-axis direction) intersecting the first direction. In the example, the first end portion E1 overlaps the second layer 12 in the X-axis direction. The first end portion E1 does not overlap the first layer 11 in the X-axis direction.

The second end portion E2 overlaps one of the third semiconductor layer 30 or the fourth layer 14 in a direction intersecting the first direction. In the example, the second end portion E2 overlaps the fourth layer 14 in the X-axis direction. The second end portion E2 does not overlap the third layer 13 in the X-axis direction.

However, for example, many grain boundaries exist inside the channel of a transistor in which polysilicon is used as the channel material. Therefore, compared to a transistor using monocrystalline Si, the carriers are easily affected by the grain boundary potential in the transistor in which polysilicon is used as the channel material. Thereby, a decrease of the carrier mobility, an increase of the S-factor (the subthreshold slope), a shift of the threshold voltage, etc., occur easily.

Conversely, the decrease of the mobility of the carriers, etc., can be suppressed by orientation control of the crystal grains so that the grain boundaries do not cross the channel perpendicularly. In the semiconductor device 101 according to the embodiment as described above, the orientation property in the first crystal orientation of the third semiconductor layer 30 is higher than the orientation property in the first crystal orientation of the first semiconductor layer 10. For example, the crystal orientation in the channel of the semiconductor device 101 is aligned to be parallel to the direction in which the current flows. Thereby, the probability of carriers crossing grain boundaries when moving from the source to the drain is reduced. Accordingly, the effects of the grain boundary potential on the carriers are reduced; and the mobility can be improved. The shift of the threshold voltage and the increase of the S-factor can be suppressed; and good subthreshold characteristics can be obtained.

In the embodiment as described above, the first end portion E1 of the first electrode 40 overlaps the second layer 12 having the low impurity concentration; and the second end portion E2 overlaps the fourth layer 14 having the low impurity concentration. In the X-axis direction, the first electrode 40 does not overlap the first layer 11 and the third layer 13 having high impurity concentrations. Thereby, leakage current due to GIDL (Gate Induced Drain Leakage), etc., can be reduced. Also, an increase of the parasitic resistance is suppressed by the end portions of the first electrode 40 overlapping the second layer 12 and the fourth layer 14.

Impurity diffusion from the source/drain regions is suppressed because the orientation property of the crystal grains is low in the first semiconductor layer 10 and the second semiconductor layer 20. For example, thermal diffusion of the impurities along the grain boundaries toward the channel is suppressed. Thereby, the GIDL can be suppressed further.

In the embodiment as described above, the crystal grains of the polysilicon layer forming the channel have an orientation property in the designated direction. Therefore, for example, the grain boundaries that cross the channel in the perpendicular direction decrease. Thereby, the effects of the grain boundary potential occurring inside the channel are reduced; and degradation of the transistor characteristics such as the threshold voltage increase, the mobility decrease, etc., can be suppressed. Also, it is possible to reduce the off-leakage occurring between the source and the drain because only the crystal at the source/drain region vicinity is not provided with high orientation property.

Figure 2B:
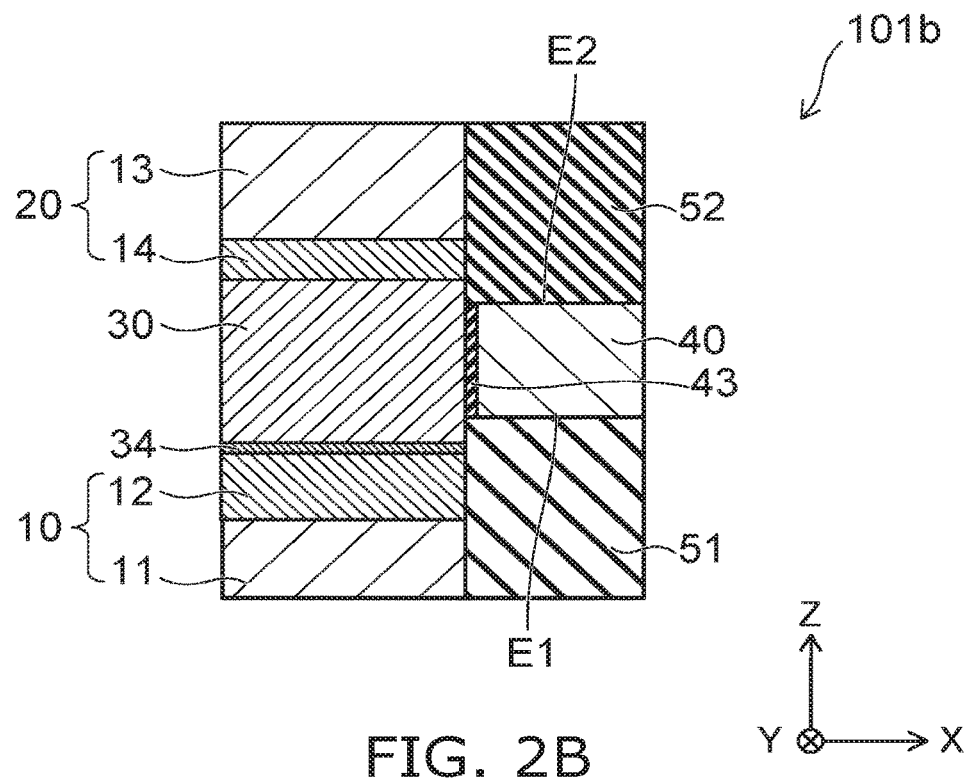

FIG. 2A and FIG. 2B are schematic cross-sectional views showing other semiconductor devices according to the first embodiment.

In a semiconductor device 101a shown in FIG. 2A, the first end portion E1 of the first electrode 40 overlaps the boundary between the second layer 12 and the fourth semiconductor layer 34 in the X-axis direction. The second end portion E2 overlaps the boundary between the fourth layer 14 and the third semiconductor layer 30 in the X-axis direction. In other words, the end portions of the first electrode 40 overlap the boundaries between a region where the crystal is randomly oriented and a region having a designated orientation property.

In a semiconductor device 101b shown in FIG. 2B, the first end portion E1 and the second end portion E2 each overlap the third semiconductor layer 30 in the X-axis direction.

Otherwise, a description similar to that of the semiconductor device 101 described in reference to FIG. 1A is applicable to the semiconductor devices 101a and 101b.

In the semiconductor devices 101a and 101b as well, similarly to the semiconductor device 101 of FIG. 1A, the crystal grains of the third semiconductor layer 30 forming the channel have an orientation property in a designated direction. Thereby, the effects of the grain boundary potential inside the channel are reduced; and the degradation of the transistor characteristics such as the increase of the threshold voltage, the decrease of the mobility of the carriers, etc., can be suppressed.

The impurities do not easily diffuse into the channel region because the orientation property of the crystal is low in the first semiconductor layer 10 and the second semiconductor layer 20. The leakage current can be suppressed because the first electrode 40 does not overlap the first layer 11 and the third layer 13 having the high impurity concentrations. In the semiconductor devices 101a and 101b, the leakage current can be suppressed further because the overlap amount of the first electrode 40 and the first and second semiconductor layers is smaller compared to that of the semiconductor device 101.

Figure 3:
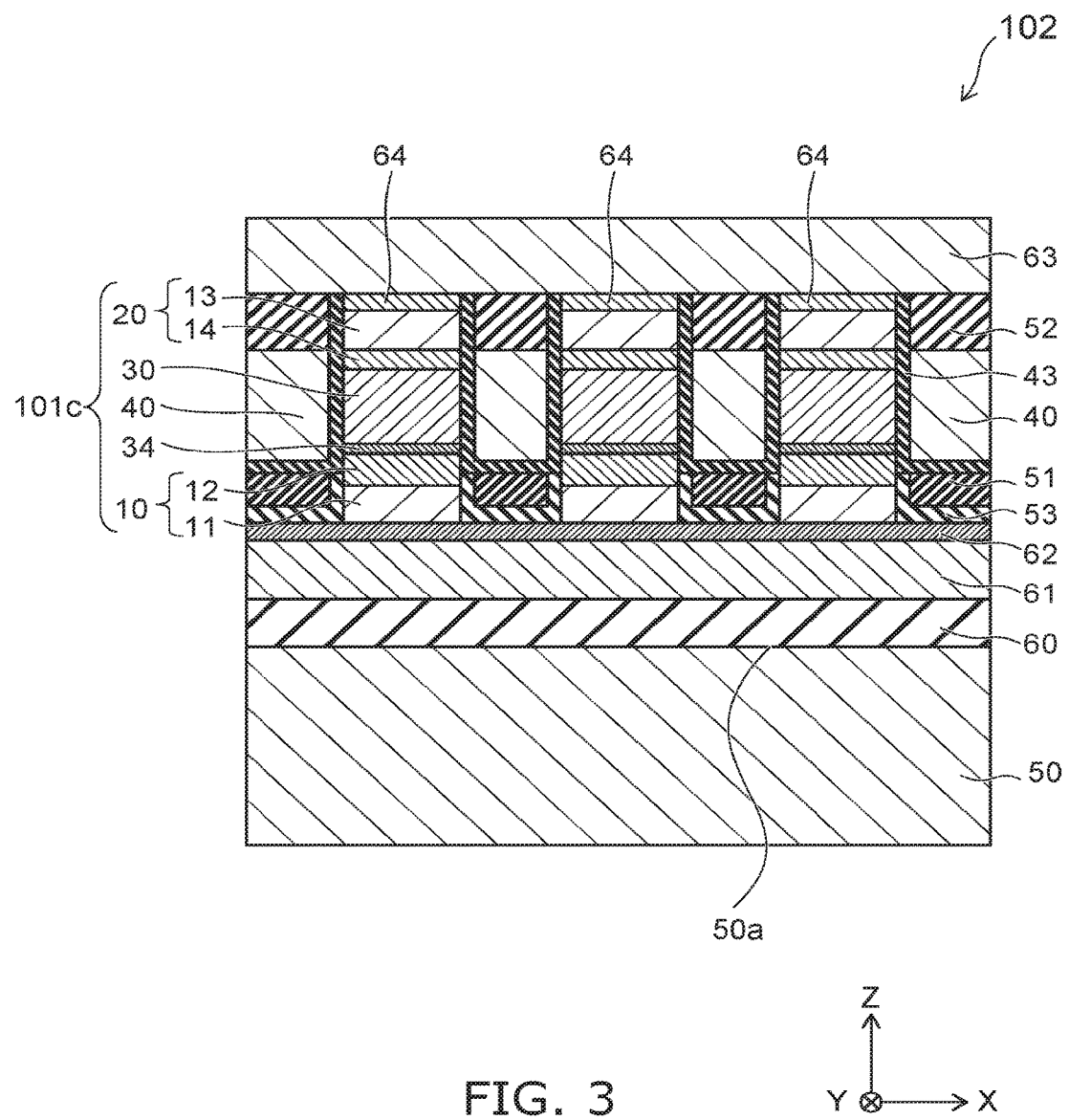
FIG. 3 is a schematic cross-sectional view showing another semiconductor device according to the first embodiment.

FIG. 3 is a schematic cross-sectional view showing another semiconductor device according to the first embodiment. The semiconductor device 102 shown in FIG. 3 includes multiple transistors (semiconductor devices 101c).

The semiconductor device 102 further includes the substrate 50, an insulating layer 60, the interconnect layer 61, a contact layer 62, a protective film 53, a contact layer 64, and the interconnect layer 63.

The multiple semiconductor devices 101c are arranged in an array configuration in the X-Y plane. For example, a not-shown device is stacked on the multiple semiconductor devices 101c. The stacked device is, for example, a memory cell array; and in such a case, the multiple semiconductor devices 101c function as driver transistors of the memory.

The memory cell array may be disposed on the lower side of the multiple semiconductor devices 101c. For example, the memory cell array may be disposed between the substrate 50 and the insulating film 60. A circuit such as CMOS, etc., may be formed in the substrate 50.

In the example shown in FIG. 3, one third semiconductor layer 30 is provided between two first electrodes 40. In other words, the transistors have double-gate structures. In the semiconductor device 101c, a portion of the insulating film 43 is provided also between the first electrode 40 and the insulating layer 51 and between the second semiconductor layer 20 and the insulating layer 52.

Otherwise, a description similar to that of the semiconductor device 101 described in reference to FIG. 1A is applicable to the semiconductor device 101c. For example, the orientation property in the first crystal orientation of the multiple third semiconductor layers 30 is higher than the orientation property in the first crystal orientation of the multiple first semiconductor layers 10. The proportion of the regions of the multiple third semiconductor layers 30 having the first crystal orientation along the channel direction is higher than the proportion of the regions of the multiple third semiconductor layers 30 having an orientation different from the first crystal orientation along the channel direction.

The semiconductor devices 101a and 101b, etc., described above may be used instead of the semiconductor device 101c. The multiple transistors (the semiconductor devices 101c) may have single gate structures.

The substrate 50 is, for example, a support substrate and may include a Si substrate.

The insulating layer 60 is provided on the substrate 50 and is disposed between the substrate 50 and the multiple semiconductor devices 101c. The insulating layer 60 includes silicon oxide ($SiO_2$), silicon nitride (SiN), or aluminum oxide ($Al_2O_3$).

The insulating layer 60 is, for example, a thermal oxide film obtained by oxidizing the substrate 50. Or, the insulating layer 60 is an insulating film deposited by a sputtering apparatus, a CVD (Chemical Vapor Deposition) apparatus, etc. The insulating layer 60 may include a stacked film in which the thermal oxide film and the insulating film are combined. The insulative properties between the substrate 50 and the interconnect layer 61 are maintained by the insulating layer 60.

The interconnect layer 61 and the contact layer 62 are provided between the insulating layer 60 and the multiple semiconductor devices 101c. The interconnect layer 61 and the contact layer 62 are electrically connected to the first semiconductor layer 10.

It is favorable for the interconnect layer 61 and the contact layer 62 to include metal materials that are heat-resistant to temperatures of 500° C. or more. For example, the interconnect layer 61 may include a metal material including W or Ti. The contact layer 62 may include at least one of W, Ti, TiN, Ni, Co, platinum (Pt), or palladium (Pd).

The protective film 53 is provided between the contact layer 62 and the insulating layer 51 and between the first semiconductor layer 10 and the insulating layer 51. The protective film 53 includes, for example, SiN.

The multiple semiconductor devices 101c are provided between the interconnect layer 63 and the interconnect layer 61.

The contact layer 64 is provided between the interconnect layer 63 and the second semiconductor layers 20. The interconnect layer 63 and the contact layer 64 are electrically connected to the second semiconductor layers 20.

The contact layer 64 contacts the polysilicon layers (the second semiconductor layers 20). Therefore, similarly to the contact layer 62, the contact layer 64 may include a metal material including W, Ti, TiN, Ni, Co, Pt, Pd, etc., as a metal material having low contact resistance.

For example, the material included in the interconnect layer 63 is determined by the thermal load of the device stacked on the semiconductor device 101c. In the case where a thermal load of 500° C. or more is applied, the interconnect layer 63 may include a metal material including W or Ti similarly to the interconnect layer 61. In the case where the thermal load is less than 500° C., the interconnect layer 63 may include a low-resistance metal material having low heat resistance such as Al, Cu, etc.

In the semiconductor device 102 as well, the polysilicon does not have a designated orientation property in the regions where the polysilicon layers (the first semiconductor layer 10 and the second semiconductor layer 20) and the first electrode 40 overlap. The polysilicon has an orientation property in the channel region (the third semiconductor layer 30) directly under the gate. Thereby, it is possible to realize a TFT having both high mobility of the carriers and low leakage.

For example, electron diffraction may be used to evaluate the orientation property (the orientation ratio) of the semiconductor device 102 as well. As an example, first, a cross section including the channel central portion of the multiple (vertical or lateral) TFTs, a cross section including the channel end portion of the multiple TFTs, or a cross section including the source (or drain) region of the multiple TFTs is acquired. For example, each cross section is parallel to the X-Y plane. Then, the orientation direction of the crystal of the polysilicon is confirmed by electron diffraction for each cross section (each observation point). Typical orientation directions of the crystal are, for example, the <100> direction, the <110> direction, and the <111> direction. At this time, the crystal grains oriented within the <100> direction±10°, the crystal grains oriented within the <110> direction±10°, and the crystal grains oriented within the <111> direction±10° are extracted. Then, for each orientation, the proportion of the crystal grains oriented in the orientation is estimated. Here, the "proportion" is the proportion of the surface area of the crystal grains oriented in the orientation of interest to the surface area of the entirety of the multiple semiconductor layers in the observed cross section. Or, the "proportion" may be the proportion of the volume of the crystal grains oriented in the orientation of interest to the volume of the entirety of the multiple semiconductor layers.

Among the proportions, in the case where the proportion of the crystals oriented in one of the designated orientations is significantly higher than the proportion of the crystals oriented in the other orientations, the polysilicon layer in the cross section (the observation point) is defined to be oriented in the one designated orientation. For example, in the case where the proportion of the crystals oriented in the <111> direction is significantly higher than the proportion of the crystals oriented in the other orientations (e.g., the case where the proportion of the crystals oriented in the <111> direction occupies 50% or more of the entirety, etc.), it can be taken that the polysilicon layer in the cross section has the <111> orientation.

For example, even in the case where the widths of the first to third semiconductor layers are narrow, the orientation property can be evaluated as recited above. In other words, even in the case where the cell size is fine, the orientation property can be evaluated statistically over multiple transistors.

The method used to observe this structure is not limited to only those recited above. The orientation directions of the crystal are not limited to only the three orientations described above.

A method for manufacturing the semiconductor device 102 will now be described.

Figure 4A:
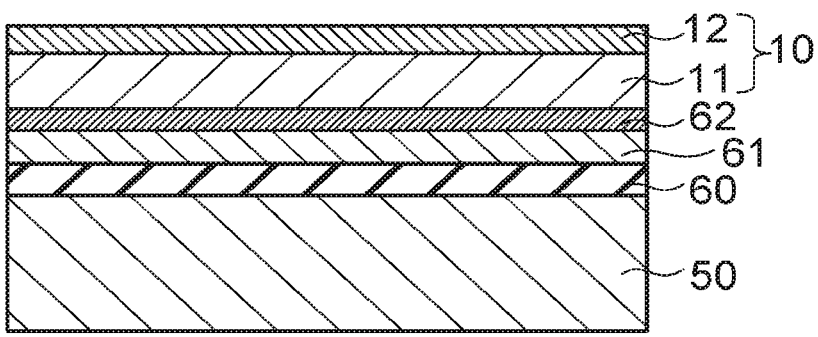
FIG. 4A to FIG. 4C are schematic cross-sectional views in order of the processes, showing the method for manufacturing the semiconductor device according to the embodiment.
Figure 4B:
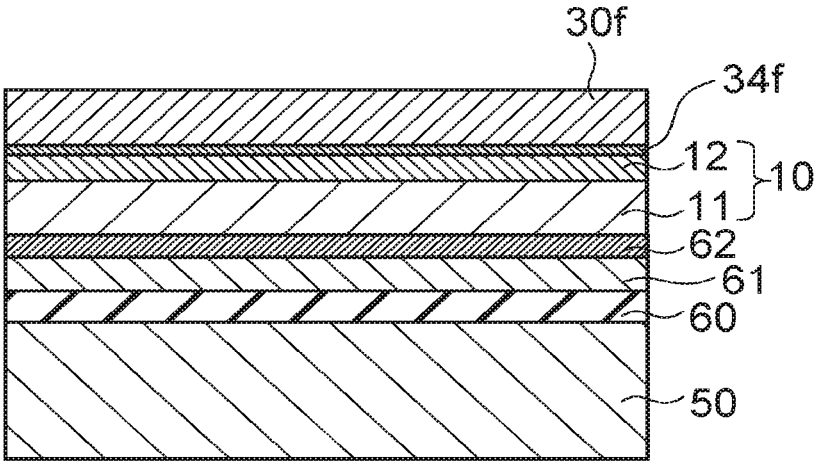
Figure 4C:
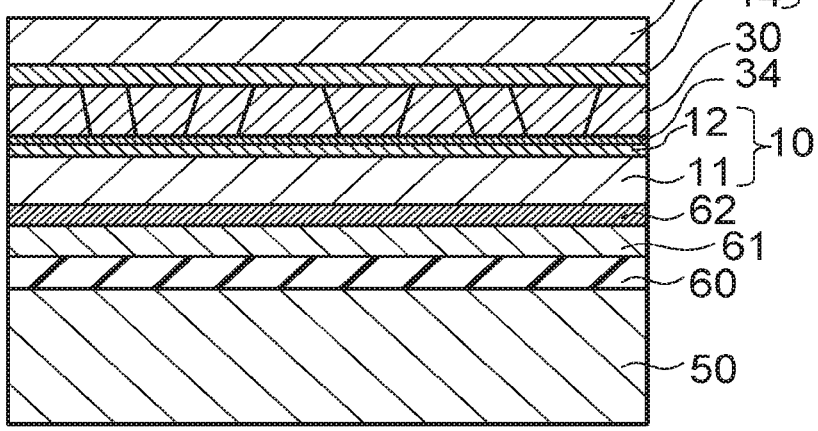

FIG. 4A to FIG. 4C are schematic cross-sectional views in order of the processes, showing the method for manufacturing the semiconductor device according to the embodiment.

As shown in FIG. 4A, the insulating layer 60, the interconnect layer 61, and the contact layer 62 are stacked in this order on the substrate 50. As described above, oxidization of the substrate 50, depositing by a sputtering apparatus, a CVD apparatus, etc., may be used to form the insulating layer 60.

A polycrystalline semiconductor layer is formed as the first semiconductor layer 10 (the first layer 11 and the second layer 12) on the contact layer 62. In the formation of the first semiconductor layer 10, the polycrystalline semiconductor layer is formed at conditions such that an orientation property in the crystal orientations of the crystal grains does not occur. For example, the polycrystalline semiconductor layer may be formed by forming a polysilicon layer directly on the contact layer 62 using a LPCVD apparatus, etc. Or, the polycrystalline semiconductor layer may be formed by forming an amorphous silicon layer by a CVD apparatus, etc., using $SiH_4$ gas at a temperature of 500° C. or more and by subsequently crystallizing the amorphous silicon layer. After forming a polysilicon layer, the polysilicon layer may be made amorphous by ion implantation of Si, etc.; and subsequently, recrystallization may be performed.

Ion implantation is used to introduce the impurity of the first conductivity type contained in the first layer 11. Or, the impurity may be introduced when forming the first layer 11 by an in-situ process inside a CVD apparatus. To reduce the sheet resistance of the first layer 11 and reduce the contact resistance between the channel and the interconnect layer, it is favorable for the impurity concentration of the first conductivity type in the first layer 11 to be not less than $1\times10^{20}$ cm$^{-3}$. As described above, for example, an impurity that provides conductivity is not introduced to the second layer 12.

Other than the impurity that provides conductivity, F or H to improve the electrical characteristics of the polysilicon, carbon (C) or Ge to introduce strain, nitrogen (N) to suppress siliciding with the interconnect layer, etc., may be introduced to the first semiconductor layer 10.

As shown in FIG. 4B, a seed layer 34f that is used to form the fourth semiconductor layer 34 is formed on the first semiconductor layer 10. The seed layer 34f is obtained by forming an amorphous silicon layer which is amorphous at a low temperature. For example, the seed layer 34f is formed at a low temperature less than 450° C. using $Si_2H_6$ gas in a CVD apparatus. Here, the thickness of the layer that is formed is, for example, 5 nm or less.

An amorphous silicon layer 30f that is used to form the third semiconductor layer 30 (the channel) is formed on the seed layer 34f. It is favorable for the amorphous silicon layer 30f to be formed at a temperature that is high compared to that of the fourth semiconductor layer 34. For example, the amorphous silicon layer 30f may be formed at a temperature of 500° C. or more using $SiH_4$ gas in a CVD apparatus.

Subsequently, heat treatment at 650° C. or less is performed to crystallize the channel. Thereby, the third semiconductor layer 30 and the fourth semiconductor layer 34 are formed by crystallizing the amorphous silicon layer 30f and the seed layer 34f into polysilicon layers.

Due to the existence of the seed layer 34f that is formed at a low temperature using $Si_2H_6$ gas, nuclear generation from the seed layer 34f decreases; and strain increases. Thereby, for example, the polysilicon layer (the third semiconductor layer 30) having the <111> orientation in the direction perpendicular to the substrate is obtained. Therefore, the crystal grain boundaries that cross the channel in a direction (e.g., a perpendicular direction) intersecting the channel direction decrease.

Subsequently, as shown in FIG. 4C, the fourth layer 14 that does not include an impurity providing conductivity is formed on the third semiconductor layer 30. The third layer 13 that includes the impurity of the first conductivity type is formed on the fourth layer 14; and the second semiconductor layer 20 is formed.

Similarly to the first semiconductor layer 10, the second semiconductor layer 20 is formed so that an orientation property in the crystal grains does not occur inside the polysilicon. To this end, the polysilicon is deposited on the third semiconductor layer 30 directly by LPCVD. Or, the polysilicon layer is made amorphous by ion implantation of Si, Ge, etc., after forming the polysilicon layer; and the polysilicon layer is subsequently recrystallized.

Figure 5A:
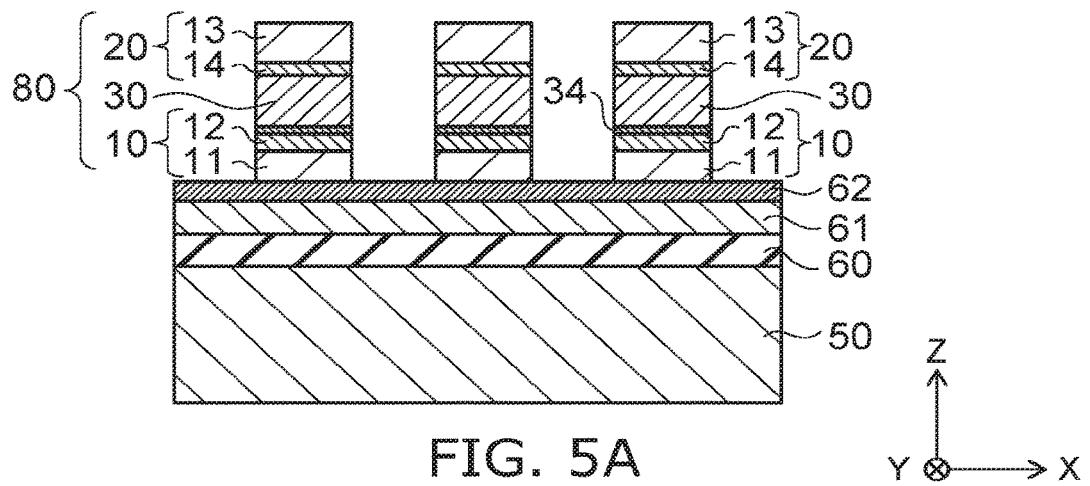
FIG. 5A to FIG. 5C are schematic cross-sectional views in order of the processes, showing the method for manufacturing the semiconductor device according to the first embodiment.
Figure 5B:
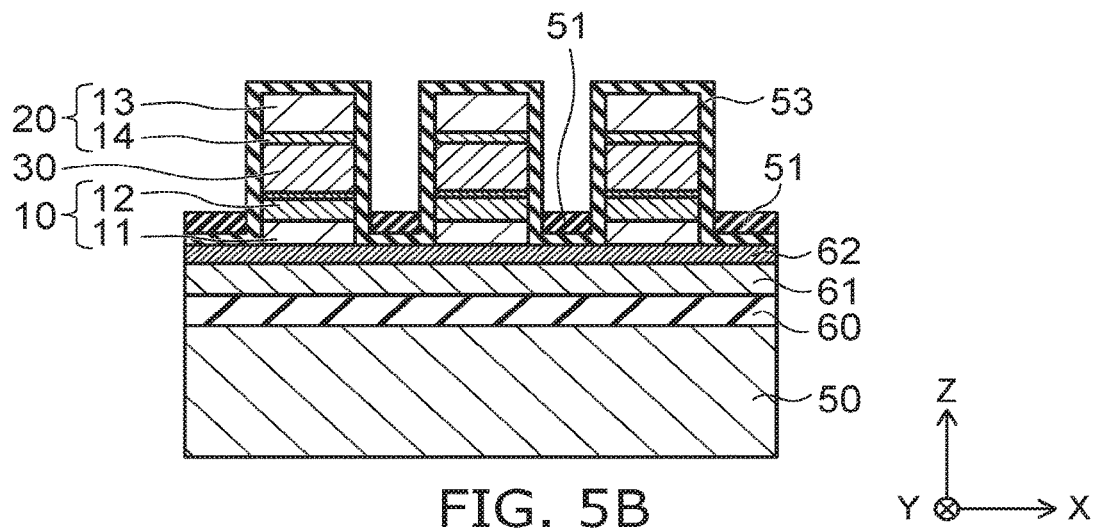
Figure 5C:
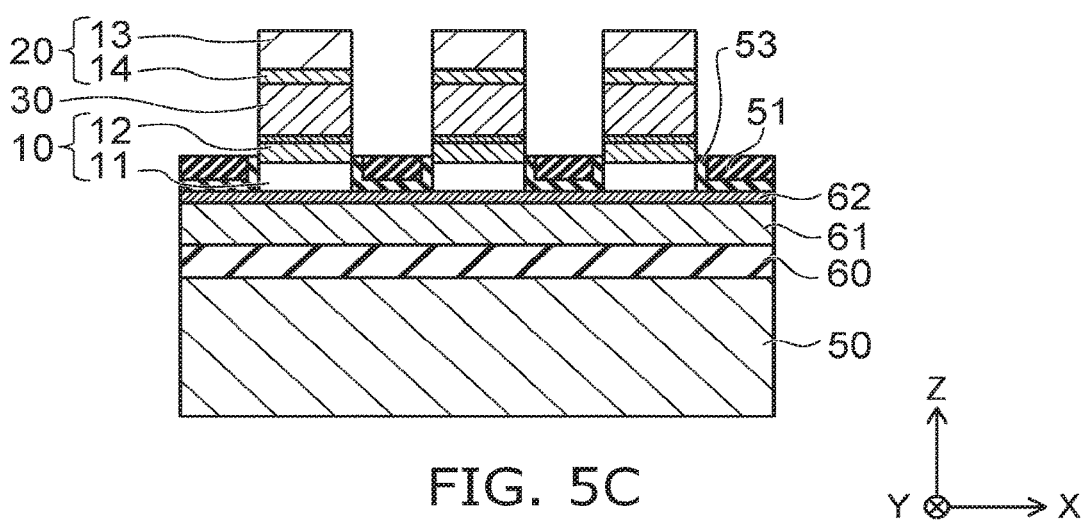

FIG. 5A to FIG. 5C are schematic cross-sectional views in order of the processes, showing the method for manufacturing the semiconductor device according to the first embodiment.

These drawings show the manufacturing processes of the semiconductor device 102 continuing from FIG. 4C. As shown in FIG. 5A, the first to fourth semiconductor layers are etched by a reactive ion etching (RIE) process. Thereby, multiple vertical FET structures 80 having columnar configurations are formed.

As shown in FIG. 5B, a SiN film is formed as the protective film 53 to cover the first to third semiconductor layers and the contact layer 62. For example, an atomic layer deposition (ALD) process may be used to form the protective film 53.

Subsequently, ALD-$SiO_2$ or polysilazane is deposited as a gap-fill film on the protective film 53. Then, etch-back of the gap-fill film is performed by an RIE process, etc. Thereby, the insulating layer 51 that is filled between the first semiconductor layers 10 is formed.

Subsequently, as shown in FIG. 5C, etch-back of the protective film 53 is performed by wet processing, etc., to expose a portion of the second layer 12. The overlap amount of the first electrode 40 and the source region (the first semiconductor layer 10) is determined by this etchback process. Therefore, in the case of the semiconductor device 101c shown in FIG. 3, the etching is performed to expose only a portion of the second layer 12. It is also possible to form the first electrode 40 such as that shown in FIG. 2A and FIG. 2B by adjusting the etching amount.

Figure 6A:
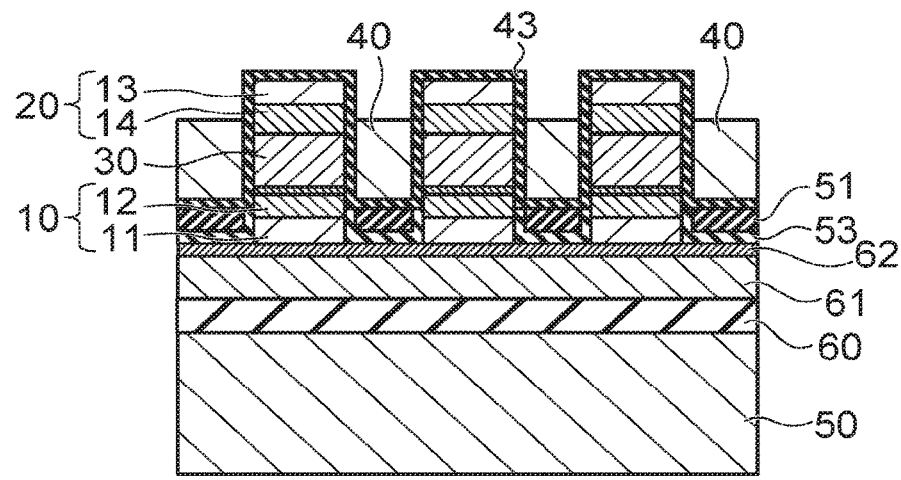
FIG. 6A and FIG. 6B are schematic cross-sectional views in order of the processes, showing the method for manufacturing the semiconductor device according to the first embodiment.
Figure 6B:
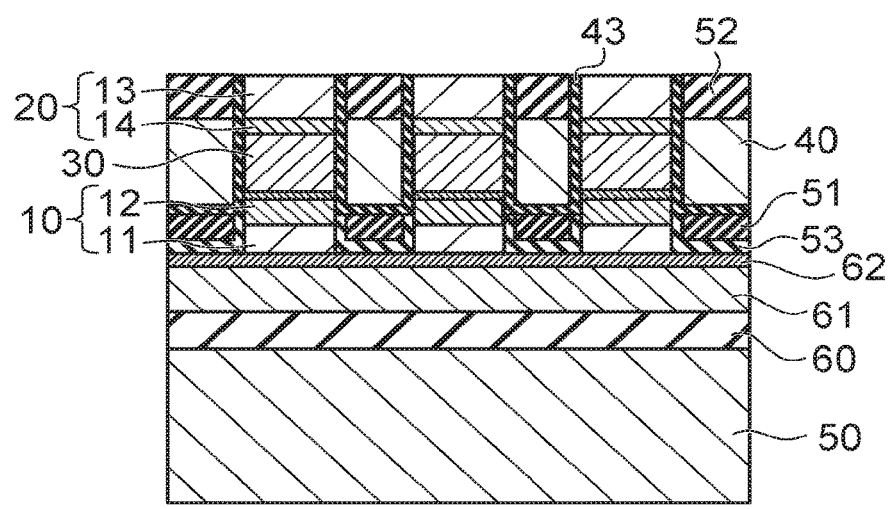

FIG. 6A and FIG. 6B are schematic cross-sectional views in order of the processes, showing the method for manufacturing the semiconductor device according to the first embodiment.

These drawings show the manufacturing processes of the semiconductor device 102 continuing from FIG. 5C. As shown in FIG. 6A, the insulating film 43 is formed by an ALD process or a CVD process on the first to third semiconductor layers and the insulating layer 51.

Subsequently, a conductive layer that is used to form the first electrode 40 is deposited by ALD or CVD on the insulating film 43. The first electrode 40 is formed by performing etch-back of the conductive layer by an RIE process, etc. At this time, the etching is performed so that only a portion of the fourth layer 14 overlaps the first electrode 40 in the X-axis direction. Thereby, as described above, the leakage current such as the GIDL, etc., can be suppressed.

Subsequently, the insulating layer 52 is formed on the first electrode 40 and the insulating film 43 by an ALD process and/or a CVD process. As shown in FIG. 6B, the insulating layer 52 is planarized by a chemical mechanical polishing (CMP) process. At this time, a portion of the insulating film 43 on the second semiconductor layer 20 also is removed. A portion of the insulating film 43 on the second semiconductor layer 20 may be removed by wet processing, etc.

Subsequently, the contact layer 64 and the interconnect layer 63 are deposited on the second semiconductor layer 20. Thereby, the semiconductor device 102 shown in FIG. 3 is formed.

Figure 7:
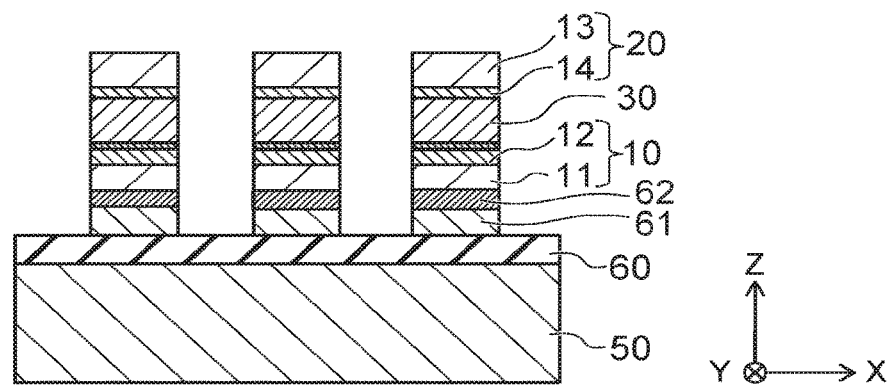
FIG. 7 is a schematic cross-sectional view showing the method for manufacturing the semiconductor device according to the first embodiment.

In FIG. 5A, the interconnect layer 61 and the contact layer 62 that are provided at the lower portion of the first semiconductor layer 10 are used commonly. However, in the embodiment, the interconnect layer 61 and the contact layer 62 may be divided into multiple interconnects as in FIG. 7. The multiple first semiconductor layers 10 are connected to mutually-different interconnects.

After forming the interconnect layer 63, a device may be formed on the interconnect layer 63. For example, it is also possible to form polycrystalline semiconductor TFTs again on the interconnect layer 63. ReRAM that uses a metal and an oxide, etc., may be stacked as three-dimensionally stacked memory. Or, after forming the inter-layer insulating film on the interconnect layer 63, it is also possible to realize a new circuit by bonding a chip of bulk Si-CMOS or a group III-V compound semiconductor using substrate bonding technology.

In the semiconductor device 102 described above, the transistor (the semiconductor device 101c) is an inversion field effect transistor. However, in the embodiment, the transistor may be an accumulation-type field effect transistor.

The method for forming the accumulation-type transistor is similar to the method described above up to the formation of the seed layer 34f. In the formation of the accumulation-type transistor, an impurity of the same conductivity type as the impurity included in the first layer 11 is introduced to the amorphous silicon layer 30f when forming the amorphous silicon layer 30f used to form the channel. In other words, P or As also is introduced to the amorphous silicon layer 30f in the case where P or As is introduced to the first layer 11.

For example, the impurity concentration in the amorphous silicon layer 30f is not less than $1 \times 10^{18}$ cm$^{-3}$. Here, the impurity concentration in the channel may be about the same as that of the source/drain regions (e.g., $1 \times 10^{20}$ cm$^{-3}$ or more); but the cut-off characteristics may degrade according to the channel thickness (the channel length). Therefore, in the case where the channel width is 10 nm or more, it is favorable for the concentration to be set to be low. In the accumulation-type transistor as well, an impurity such as F, H, etc., may be introduced to terminate the defects inside the channel. Subsequently, the seed layer 34f and the amorphous silicon layer 30f are crystallized by performing heat treatment at 650° C. or less as crystallization annealing. Thereby, polysilicon layers are formed as the third semiconductor layer 30 and the fourth semiconductor layer 34.

Unlike the inverted transistor, the conductivity types of the channel and the source are the same in the accumulation-type transistor. Therefore, in the accumulation-type transistor, compared to the inverted transistor, threshold voltage modulation due to impurity diffusion into the channel is reduced. Accordingly, the accumulation-type transistor is effective to adjust the threshold voltage. On the other hand, as described above, although dependent on the impurity concentration in the channel, the subthreshold characteristics may undesirably degrade if the channel thickness of the accumulation-type transistor is not a thin film of about 10 nm or less.

After forming the third semiconductor layer 30 by crystallizing, the drain region is formed; and the polysilicon layer is patterned into a pillar configuration. The subsequent processes are similar to those of the formation of the inverted transistor and are therefore omitted.

Figure 8:
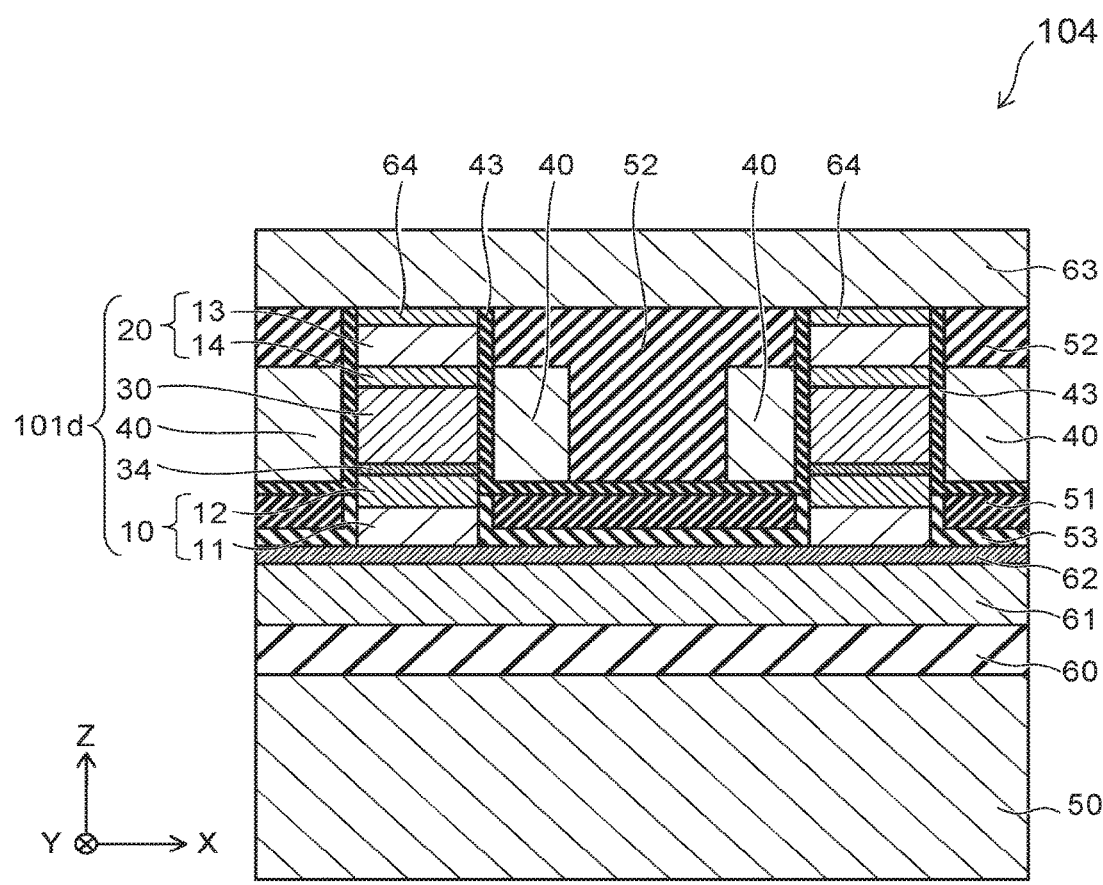
FIG. 8 is a schematic cross-sectional view showing another semiconductor device according to the first embodiment.

FIG. 8 is a schematic cross-sectional view showing another semiconductor device according to the first embodiment.

The semiconductor device according to the embodiment is not limited to the example of the semiconductor device 102 shown in FIG. 3 and may be, for example, a semiconductor device such as the semiconductor device 104 shown in FIG. 8.

Similarly to the semiconductor device 102 described in reference to FIG. 3, the semiconductor device 104 includes multiple transistors (semiconductor devices 101d), the substrate 50, the insulating layer 60, the interconnect layer 61, the contact layer 62, the protective film 53, the contact layer 64, and the interconnect layer 63.

In the example of FIG. 8, two first electrodes 40 are provided between mutually-adjacent third semiconductor layers 30 of the multiple third semiconductor layers 30. A portion of the insulating layer 52 is provided also between the two first electrodes 40 recited above. Otherwise, a description similar to that of the semiconductor device 102 described in reference to FIG. 3 is applicable to the semiconductor device 104.

Second Embodiment

Figure 9:
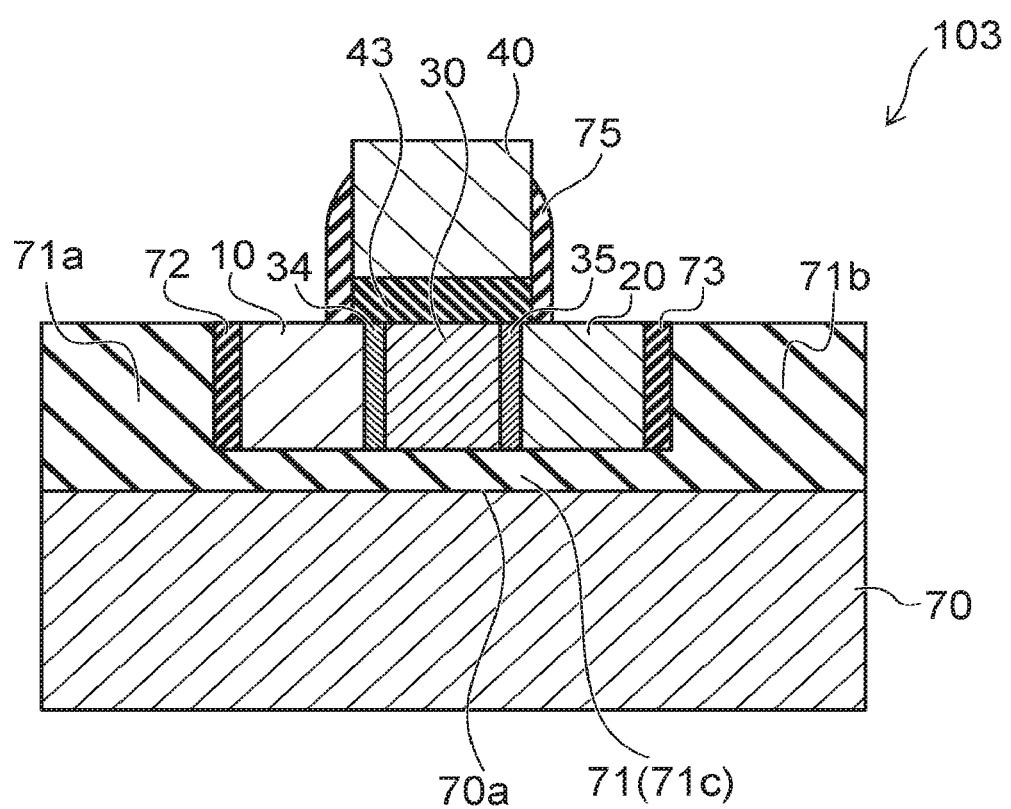
FIG. 9 is a schematic cross-sectional view showing a semiconductor device according to a second embodiment.

FIG. 9 is a schematic cross-sectional view showing a semiconductor device according to a second embodiment.

The first semiconductor layer 10, the second semiconductor layer 20, the third semiconductor layer 30, the fourth semiconductor layer 34, the first electrode 40, and the insulating film 43 are provided in the semiconductor device 103 shown in FIG. 9 as well. A description similar to the description of the semiconductor device 101 of FIG. 1A is applicable here as well. The semiconductor device 103 further includes a substrate 70, an insulating layer 71, an insulating layer 72, an insulating layer 73, an insulating layer 75, and a fifth semiconductor layer 35.

The substrate 70 is, for example, a support substrate. The support substrate may include a Si substrate. As shown in FIG. 9, the substrate 70 has a first surface 70a (a major surface).

The semiconductor device 103 according to the embodiment is, for example, a lateral transistor. In other words, the first to third semiconductor layers, etc., are provided on the first surface 70a; and the channel direction connecting the source and the drain is parallel to the first surface 70a.

The insulating layer 71 is provided on the first surface 70a of the substrate 70. The material of the insulating layer 71 includes, for example, SiN, Al$_2$O$_3$, SiO$_2$, etc.

The insulating layer 72 and the insulating layer 73 are provided on the insulating layer 71 (71c) between a portion 71a of the insulating layer 71 and another portion 71b of the insulating layer 71. The insulating layer 72 and the insulating layer 73 include, for example, Al$_2$O$_3$, SiO$_2$, etc.

The first semiconductor layer 10 is positioned between the insulating layer 72 and the insulating layer 73; the third semiconductor layer 30 is positioned between the first semiconductor layer 10 and the insulating layer 73; and the second semiconductor layer 20 is positioned between the third semiconductor layer 30 and the insulating layer 73.

The fifth semiconductor layer 35 is provided between the second semiconductor layer 20 and the third semiconductor layer 30. The material, etc., of the fifth semiconductor layer 35 are similar to those of the fourth semiconductor layer 34.

For example, the insulating layer 75 is provided to cover a portion of the side surface of the first electrode 40. The insulating layer 75 is, for example, the sidewall of the gate electrode. SiO$_2$ and SiN may be used as the material of the insulating layer 75.

A method for manufacturing the semiconductor device 103 will now be described.

FIG. 10A to FIG. 10D are schematic cross-sectional views in order of the processes, showing the method for manufacturing the semiconductor device according to the second embodiment.

Figure 10A:
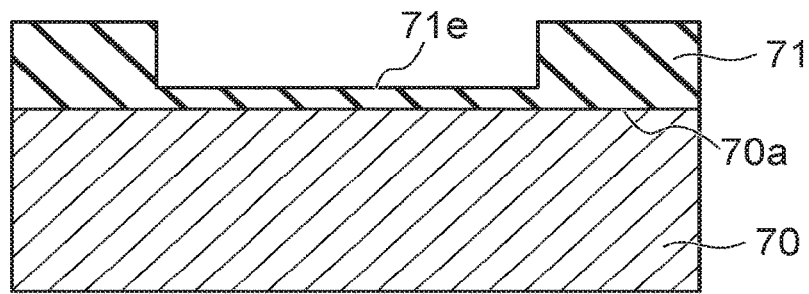
FIG. 10A to FIG. 10D are schematic cross-sectional views in order of the processes, showing the method for manufacturing the semiconductor device according to the second embodiment.

As shown in FIG. 10A, the insulating layer 71 is formed on the substrate 70. In the formation of the insulating layer 71, first, an insulating film is formed on the substrate 70; and the insulating film is patterned by lithography and an RIE process. Thereby, a recess 71e is made in the insulating layer 71. A TFT structure that includes polycrystalline semiconductor layers (the first to third semiconductor layers) is filled into the recess 71e.

In the case where polysilicon is used as the polycrystalline semiconductor layer, the material of the insulating layer 71 is such that it is difficult to form an amorphous silicon film on the insulating layer 71. For example, SiN or Al$_2$O$_3$ may be used. On the other hand, the material of the insulating layer 71 includes $SiO_2$, SiN, etc., in the case where a group III-V compound is used as the polycrystalline semiconductor layer.

Figure 10B:
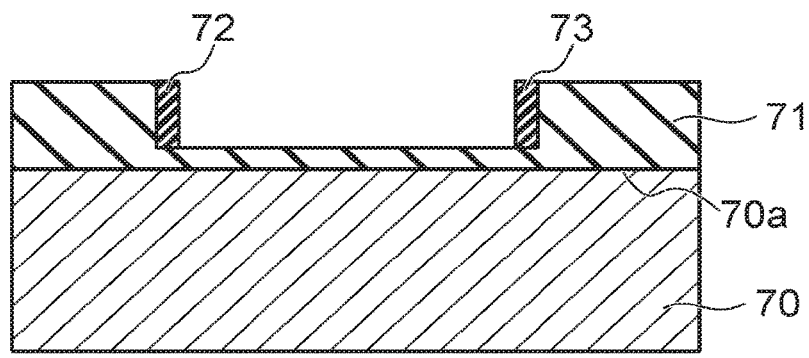

Subsequently, as shown in FIG. 10B, an insulating film is formed only on the side surface of the recess 71e by performing RIE, etc., after forming the insulating film on the insulating layer 71 by, for example, an ALD process, etc. Thereby, the insulating layer 72 and the insulating layer 73 are formed.

In the case where the polycrystalline semiconductor layer includes a group III-V compound semiconductor such as InGaAs, GaSb, etc., an $Al_2O_3$ film or the like may be used as the insulating layer 72 and the insulating layer 73. A $SiO_2$ film or the like may be used as the insulating layer 72 and the insulating layer 73 in the case where the polycrystalline semiconductor layer includes a group IV material such as Si, Ge, etc.

In the following example, the case is described where polysilicon is used as the material of the polycrystalline semiconductor layer, and $SiO_2$ is used as the materials of the insulating layer 72 and the insulating layer 73. However, the material of the polycrystalline semiconductor layer in the embodiment is not limited to that recited above. For example, Si, Ge, $Si_xGe_{1-x}$ (0<x<1), GaSb, InAs, or $In_xGa_{1-x}As$ (0<x<1) may be used as the material of the polycrystalline semiconductor layer.

Figure 10C:
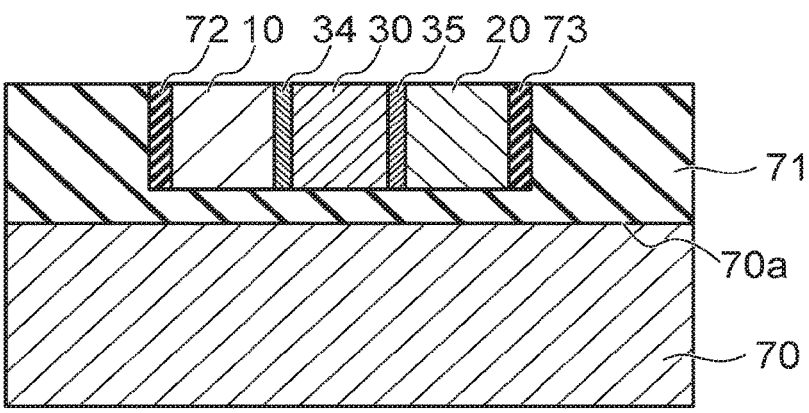

Subsequently, the first semiconductor layer 10 and the second semiconductor layer 20 are formed as shown in FIG. 10C. Similarly to the first embodiment, the first semiconductor layer 10 and the second semiconductor layer 20 are formed so that the crystal grains do not have a designated orientation property. To this end, for example, a polysilicon layer is formed directly on the insulating layer 71 by LPCVD, etc. Or, crystallizing is performed by heat treatment at 600° C. or more after forming an amorphous silicon layer using $SiH_4$ gas at a temperature of 500° C. or more. Using the conditions used to form the amorphous silicon layer, amorphous silicon is formed on the insulating layers 72 and 73; but amorphous silicon does not form easily on the insulating layer 71.

Subsequently, an amorphous silicon layer (a seed layer) that is used to form the fourth semiconductor layer 34 and the fifth semiconductor layer 35 is formed. For example, the seed layer can be formed at a low temperature less than 450° C. using $Si_2H_6$ gas by a CVD apparatus. The thickness (the length along the channel direction) of the seed layer is, for example, 5 nm or less. The crystallinity of the third semiconductor layer 30 can be controlled by forming the seed layer.

After the seed layer is formed, an amorphous silicon layer that is used to form the third semiconductor layer 30 is further formed. For example, the amorphous silicon layer is formed at a temperature of 500° C. or more using $SiH_4$ gas by a CVD apparatus. An impurity that provides conductivity may be introduced to the amorphous silicon layer that is formed for threshold voltage adjustment. For example, in the case where a pMOSFET is formed, P or As is used as the impurity; and in the case where an nMOSFET is formed, B or $BF_2$ may be used as the impurity. F or H may be introduced to improve the electrical characteristics.

Subsequently, heat treatment at 600° C. or more is performed. Thereby, the amorphous silicon is crystallized into polysilicon. After the crystallizing, only the third semiconductor layer 30, the fourth semiconductor layer 34, and the fifth semiconductor layer 35 have the orientation property of the crystal grains in directions parallel to the first surface 70a. The orientation property of the crystal grains is low (e.g., there is no orientation property) in the first semiconductor layer 10 and the second semiconductor layer 20.

Planarizing is performed by a CMP process to remove the Si protruding upward from the recess 71e. Thereby, a flat polysilicon layer in which only the polysilicon layer of the central portion has a crystal orientation can be obtained. The impurity introduction into the channel may be performed after the planarization by CMP; and recrystallizing anneal may be performed.

The manufacturing processes after forming the polysilicon layer which is the channel are similar to a normal TFT formation process flow.

Figure 10D:
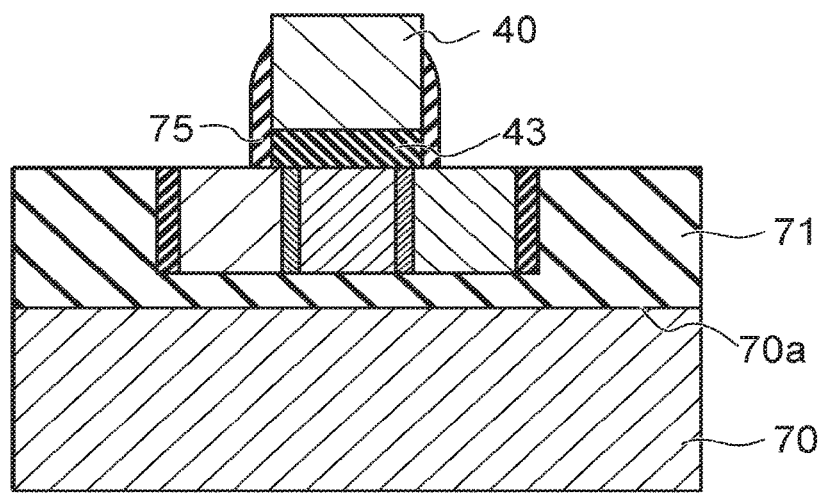

As shown in FIG. 10D, for example, a gate stack structure is formed by stacking the insulating film 43 and the first electrode 40 on at least the third semiconductor layer 30. Lithography and an RIE process may be used to form the gate stack structure.

After forming the gate stack structure, a $SiO_2$ film that is used to form the insulating layer 75 and the like are stacked to cover the side surface and upper surface of the first electrode 40. Subsequently, the insulating layer 75 is formed as a sidewall by an RIE process.

Subsequently, ion implantation of an impurity is performed into the source/drain regions (a portion of the first semiconductor layer 10 and a portion of the second semiconductor layer 20). In the case where the nMOSFET is formed, P or As is implanted as the impurity. In the case where the pMOSFET is formed, B or $BF_2$ is implanted as the impurity. Further, to introduce strain, C may be introduced as an impurity in the case of the nMOSFET; and Ge may be introduced in the case of the pMOSFET. Activation anneal is performed after the ion implantation. Subsequently, a silicide layer is formed in the source/drain regions by a self-aligning process using a metal material such as Ni, etc. Then, the interconnect layers that are electrically connected to the silicide layer are appropriately formed.

The semiconductor device 103 shown in FIG. 9 can be formed as described above.

In the semiconductor device 103 which is the lateral TFT as well, similarly to the semiconductor device 101 which is the vertical TFT, the orientation property of the crystal grains is high only inside the channel. Therefore, the degradation of the transistor characteristics such as the shift of the threshold voltage, the mobility decrease of the carriers, etc., can be suppressed.

In the lateral TFT, the impurity implantation of the source/drain regions is performed after forming the sidewall. Therefore, the first electrode 40 does not overlap the source/drain regions having the high impurity concentration in a direction perpendicular to the channel direction. Thereby, the GIDL can be suppressed; and the leakage current can be reduced. Further, similarly to the first embodiment, the first semiconductor layer 10 and the second semiconductor layer 20 that have low orientation properties are positioned directly under the end portions of the first electrode. Therefore, the diffusion of the impurities from the source/drain regions into the channel is suppressed. Accordingly, for this reason as well, the GIDL is suppressed; and the leakage current can be reduced.

According to the embodiments, a semiconductor device in which the mobility of the carriers is improved can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel. The term "electrically connected" includes not only the case of being connected in direct contact, but also the case of being connected through e.g. another conductive member.

Hereinabove, embodiments of the invention are described with reference to specific examples. However, the invention is not limited to these specific examples. For example, one skilled in the art may similarly practice the invention by appropriately selecting specific configurations of components such as the first semiconductor layer, the second semiconductor layer, the third semiconductor layer and the first electrode, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first semiconductor layer;
   a second semiconductor layer disposed above the first semiconductor layer;
   a third semiconductor layer provided between the first semiconductor layer and the second semiconductor layer;
   a fourth semiconductor layer different from the first, second, and third semiconductor layers and provided between the first semiconductor layer and the third semiconductor layer and having the same orientation properties as the third semiconductor layer; and
   a first electrode opposing the third semiconductor layer, the first semiconductor layer including:
      a first layer including an impurity of a first conductivity type; and
      a second layer provided between the first layer and the third semiconductor layer,
   a concentration of the impurity in the first layer being higher than a concentration of the impurity in the second layer, and
   an orientation ratio of the third semiconductor layer is higher than an orientation ratio of the second layer,
   the second layer including one or more first crystal regions having a first crystal orientation along a first direction from the first semiconductor layer toward the second semiconductor layer,
   the third semiconductor layer including one or more second crystal regions having the first crystal orientation along the first direction,
   the orientation ratio of the second layer being a ratio of a total area of the first crystal regions in a first cross section to an entire area of the first semiconductor layer in the first cross section, the first cross section being along a first plane perpendicular to the first direction, and
   the orientation ratio of the third semiconductor layer being a ratio of a total area of the second crystal regions in a second cross section to an entire area of the third semiconductor layer in the second cross section, the second cross section being parallel to the first cross section.

2. The device according to claim 1, wherein a density of grain boundaries in the third semiconductor layer is lower than a density of grain boundaries in the first semiconductor layer.

3. The device according to claim 1, wherein an average size of crystal grains in the third semiconductor layer is larger than an average size of crystal grains in the first semiconductor layer.

4. The device according to claim 1, wherein
   the orientation ratio of the third semiconductor layer is higher than an orientation ratio of the second semiconductor layer,
   the second semiconductor layer includes one or more third crystal regions having the first crystal orientation along the first direction,
   the orientation ratio of the second semiconductor layer is a ratio of a total area of the third crystal regions in a third cross section to an entire area of the second semiconductor layer in the third cross section, the third cross section being parallel to the first cross section.

5. The device according to claim 1, wherein
   the first electrode includes a first end portion and a second end portion in the first direction, and
   the first end portion overlaps one of the third semiconductor layer and the second layer in a direction intersecting the first direction.

6. The device according to claim 5, wherein the first end portion overlaps the second layer in the intersecting direction.

7. The device according to claim 1, wherein
   the second semiconductor layer includes:
      a third layer including the impurity of the first conductivity type; and
      a fourth layer provided between the third layer and the third semiconductor layer,
   a concentration of the impurity in the third layer is higher than a concentration of the impurity in the fourth layer.

8. The device according to claim 7, wherein
   the first electrode includes a first end portion and a second end portion in the first direction,
   the first end portion overlaps one of the third semiconductor layer or the second layer in a direction intersecting the first direction, and
   the second end portion overlaps one of the third semiconductor layer or the fourth layer in the intersecting direction.

9. The device according to claim 1, wherein
   the third semiconductor layer includes a first portion and a second portion in a fourth cross section along a second plane perpendicular to the first direction,
   the first portion having the first crystal orientation,
   the second portion having a second crystal orientation, an area of the first portion in the fourth cross section is larger than an area of the second portion in the fourth cross section.

10. The device according to claim 9, wherein the first crystal orientation is one of the <100> direction, the <110> direction, or the <111> direction.

11. The device according to claim 1, wherein
the third semiconductor layer includes a crystal of a first material, and
the first material is one of Si, Ge, $Si_xGe_{1-x}$ (0<x<1), $In_xGa_{1-x}As$ (0≤x≤1), or $In_xGa_{1-x}Sb$ (0≤x≤1).

12. The device according to claim 11, wherein the third semiconductor layer includes a polycrystal of the first material.

13. The device according to claim 12, wherein a density of grain boundaries extending along the first direction in the third semiconductor layer is higher than a density of grain boundaries extending along a direction intersecting the first direction in the third semiconductor layer.

14. The device according to claim 11, wherein the first semiconductor layer and the second semiconductor layer include a polycrystal of the first material.

15. The device according to claim 1, further comprising a substrate having a first surface,
the first semiconductor layer being disposed on the first surface,
a first direction from the first semiconductor layer toward the second semiconductor layer intersecting the first surface.

16. The device according to claim 1, wherein
the first semiconductor layer includes a first grain boundary existing in a first region included in the first cross section,
the third semiconductor layer includes a second grain boundary existing in a second region included in the second cross section of the third semiconductor layer,
an area of the first region is same as an area of the second region,
a second length of the second grain boundary in the second region is shorter than a first length of the first grain boundary in the first region.

17. The device according to claim 1, wherein
the first semiconductor layer includes a fourth crystal region having the first crystal orientation included in a first cross section region of the first semiconductor layer, the first cross section region being along the first plane,
the third semiconductor layer includes a fifth crystal region having the first crystal orientation included in a second cross section region of the third semiconductor layer, the second cross section region being along the first plane, an area of the first cross section region is same as an area of the second cross section region,
an area of the fifth crystal region in the second cross section region is larger than an area of the fourth crystal region in the first cross section region.

18. The device according to claim 1, wherein the first crystal orientation is the <110> direction, or the <111> direction.

* * * * *